(12) United States Patent
Kim et al.

(10) Patent No.: US 7,741,216 B2
(45) Date of Patent: Jun. 22, 2010

(54) METAL LINE OF SEMICONDUCTOR DEVICE AND METHOD FOR FORMING THE SAME

(75) Inventors: Jeong Tae Kim, Gyeonggi-do (KR); Seung Jin Yeom, Gyeonggi-do (KR); Baek Mann Kim, Gyeonggi-do (KR); Dong Ha Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/326,374

(22) Filed: Dec. 2, 2008

(65) Prior Publication Data
US 2009/0166870 A1  Jul. 2, 2009

(30) Foreign Application Priority Data
Jan. 2, 2008  (KR) ............... 10-2008-0000319

(51) Int. Cl.
*H01L 23/52*  (2006.01)
*H01L 21/4763*  (2006.01)
(52) U.S. Cl. .............. 438/643; 257/751; 257/E21.495; 257/E21.141
(58) Field of Classification Search ......... 257/751, 257/E21.495, E21.141; 438/643

See application file for complete search history.

(56) References Cited

U.S. PATENT DOCUMENTS

| 5,985,759 | A | 11/1999 | Kim et al. | |
|---|---|---|---|---|
| 6,528,180 | B1* | 3/2003 | Lee et al. | 428/621 |
| 2005/0186793 | A1* | 8/2005 | Omoto et al. | 438/687 |
| 2006/0018057 | A1* | 1/2006 | Huai | 360/324.2 |
| 2006/0113675 | A1* | 6/2006 | Chang et al. | 257/763 |

FOREIGN PATENT DOCUMENTS

| JP | 2003-17437 | * | 1/2003 |
|---|---|---|---|
| JP | 2004-323493 | * | 11/2004 |
| JP | 2006-93552 | * | 4/2006 |
| KR | 100126654 B1 | | 10/1997 |
| KR | 1020010090729 A | | 10/2001 |

* cited by examiner

*Primary Examiner*—Matthew Smith
*Assistant Examiner*—Walter H Swanson
(74) *Attorney, Agent, or Firm*—Ladas & Parry LLP

(57) ABSTRACT

A metal line of a semiconductor device includes an insulation layer formed on a semiconductor substrate and having a metal line forming region. A diffusion barrier is formed on a surface of the metal line forming region of the insulation layer. The diffusion barrier has a multi-layered structure of a V layer, a $V_xN_y$ layer and a $V_xN_yO_z$ layer. A metal layer is formed on the diffusion barrier to fill the metal line forming region of the insulation layer.

30 Claims, 5 Drawing Sheets

METAL LINE OF SEMICONDUCTOR DEVICE AND METHOD FOR FORMING THE SAME

CROSS-REFERENCE TO RELATED APPLICATIONS

The present application claims priority to Korean patent application number 10-2008-0000319 filed on Jan. 2, 2008, which is incorporated herein by reference in its entirety.

BACKGROUND OF THE INVENTION

The present invention relates generally to a metal line of a semiconductor device and a method for forming the same, and more particularly, to a metal line of a semiconductor device that can improve the characteristics of a diffusion barrier and can thereby improve the characteristics and the reliability of a semiconductor device and a method for forming the same.

Generally, in a semiconductor device, metal lines are formed to electrically connect elements or lines to each other. Contact plugs are formed to connect lower metal lines and upper metal lines to each other. In order to conform to the trend towards highly integrated semiconductor devices, a design rule has decreased. Because of the decrease in the design rule, the aspect ratio of a contact hole in which a contact plug is formed has gradually increased. As a result, the difficulty of forming a metal line and the importance of a process for forming the metal line and the contact plug have received great attention from designers.

Aluminum and tungsten have been mainly used as the material for the metal line of a semiconductor device, since these materials have good electrical conductivity. In addition, copper has recently been recognized as having potential as a next-generation material for a metal line due to the excellent electrical conductivity and low resistance of copper when compared to aluminum and tungsten. Copper (Cu) has been recognized as potentially solving the problems associated with RC signal delay in a semiconductor device having a high level of integration and high operating speed.

Since copper cannot be easily dry-etched into a wiring pattern, a damascene process is employed to form a metal line of copper. In the damascene metal line forming process, a metal line forming region is formed by etching an interlayer dielectric, and a metal line is formed by filling a copper layer in the metal line forming region. The types of damascene processes can generally be divided into a single damascene process and a dual damascene process.

Where applying the damascene process, in a multi-layered metal line, an upper metal line and a contact plug for connecting the upper metal line and a lower metal line can be simultaneously formed. Also, surface undulations that are produced due to the presence of the metal line can be removed, and therefore a subsequent process can be conveniently conducted.

Further, when using copper as the material for the metal line, unlike the case in which aluminum is used, copper diffuses to a semiconductor substrate through the interlayer dielectric. The diffused copper acts as deep-level impurities in the semiconductor substrate made of silicon and induces leakage current. Therefore, it is necessary to form a diffusion barrier at an interface between a copper layer and the interlayer dielectric. Generally, the diffusion barrier is made of a TiN layer, a Ta layer or a TaN layer.

However, in the conventional art as described above, when manufacturing an ultra-highly integrated semiconductor device below 40 nm, the characteristics of the diffusion barrier made of any one of the TiN layer, the Ta layer and the TaN layer are likely to deteriorate, leakage current is likely to be induced, and contact resistance is likely to increase, whereby the characteristics and the reliability of the semiconductor device can be degraded.

SUMMARY OF THE INVENTION

Embodiments of the present invention are directed to a metal line of a semiconductor device which can improve the characteristics of a diffusion barrier and a method for forming the same.

Also, embodiments of the present invention are directed to a metal line of a semiconductor device which can improve the characteristics and the reliability of a semiconductor device and a method for forming the same.

In one aspect of the present invention, a metal line of a semiconductor device comprises an insulation layer formed on a semiconductor substrate and having a metal line forming region; a diffusion barrier formed on a surface of the metal line forming region of the insulation layer and having a multi-layered structure of a V layer, a $V_xN_y$ layer and a $V_xN_yO_z$ layer; and a metal layer formed on the diffusion barrier to fill the metal line forming region of the insulation layer.

The V layer has a thickness in the range of 10~100 Å.

The $V_xN_y$ layer has a thickness in the range of 5~50 Å.

In the $V_xN_y$ layer, x has a range of 0.8~0.95 and y has a range of 0.05~0.2.

The $V_xN_yO_z$ layer has a thickness in the range of 5~50 Å.

In the $V_xN_yO_z$ layer, x has a range of 0.7~0.94 and y has a range of 0.05~0.2.

The metal layer comprises a copper layer.

In another aspect of the present invention, a method for forming a metal line of a semiconductor device comprises the steps of forming an insulation layer which has a metal line forming region, on a semiconductor substrate; forming a diffusion barrier which has a multi-layered structure of a V layer, a $V_xN_y$ layer and a $V_xN_yO_z$ layer, on the insulation layer including a surface of the metal line forming region; and forming a metal layer on the diffusion barrier to fill the metal line forming region.

The step of forming the diffusion barrier comprises the steps of forming a V layer on the insulation layer including a surface of the metal line forming region; forming a $V_xN_y$ layer on the V layer; and forming a $V_xN_yO_z$ layer by oxidating a surface of the $V_xN_y$ layer.

The V layer is formed to have a thickness in the range of 10~100 Å.

The V layer is formed through PVD or CVD.

The CVD is conducted using $V(NMe_2)_4$ in the range of sccm as source gas.

The CVD is conducted at a temperature in the range of 200~500° C. under pressure in the range of 0.1~10 Torr.

The $V_xN_y$ layer is formed as a layer in which x has a range of 0.8~0.95 and y has a range of 0.05~0.2.

The $V_xN_y$ layer is formed to have a thickness in the range of 5~50 Å.

The $V_xN_y$ layer is formed through any one of PVD, CVD and ALD.

The CVD is conducted using $V(NMe_2)_4$ and $NH_3$ each having an amount in the range of 10~100 sccm as source gas.

The CVD is conducted at a temperature in the range of 200~500° C. under pressure in the range of 0.1~10 Torr.

The ALD is conducted by alternately supplying $V(NMe_2)_4$ and $NH_3$ each having an amount in the range of 10~100 sccm as source gas.

The ALD is conducted at a temperature in the range of 200~500° C. under pressure in the range of 0.1~10 Torr.

The $V_xN_y$ layer is formed by nitriding a surface of the V layer.

Nitridation of the V layer is conducted by annealing the V layer under a nitrogen atmosphere or plasma-processing the V layer.

The annealing is conducted using $N_2$ in the range of 10~1,000 sccm.

The annealing is conducted at a temperature in the range of 200~500° C.

The plasma processing is conducted using $N_2$ in the range of 10~500 sccm.

The plasma processing is conducted at a temperature in the range of 200~500° C. under pressure in the range of 1~10 Torr.

The plasma processing is conducted with RF power in the range of 100~1,000 W.

The $V_xN_yO_z$ layer is formed as a layer in which x has a range of 0.7~0.94, y has a range of 0.05~0.2, and z has a range of 0.01~0.1.

The $V_xN_yO_z$ layer is formed to have a thickness in the range of 5~50 Å.

Oxidation of the $V_xN_y$ layer is conducted by annealing the $V_xN_y$ layer under an oxygen atmosphere or plasma-processing the $V_xN_y$ layer.

The metal layer comprises a copper layer.

DESCRIPTION OF SPECIFIC EMBODIMENTS

In the present invention, a diffusion barrier, which has a multi-layered structure of a V layer, a $V_xN_y$ layer and a $V_xN_yO_z$ layer, is formed between a copper layer and an insulation layer. By forming the diffusion barrier in this manner, the characteristics of the diffusion barrier can be improved even without increasing the thickness of the diffusion barrier when compared to the conventional art, due to a stuffing effect of an oxygen and a boundary interruption between the an upper layer and a lower layer according to the multi-layered structure. Accordingly, in the present invention, by improving the characteristics of the diffusion barrier, it is possible to prevent a constituent of the copper layer from diffusing and leakage current and contact resistance from increasing, whereby the characteristics and the reliability of a semiconductor device can be improved.

Hereafter, the specific embodiments of the present invention will be described in detail with reference to the attached drawings.

Figure 1:
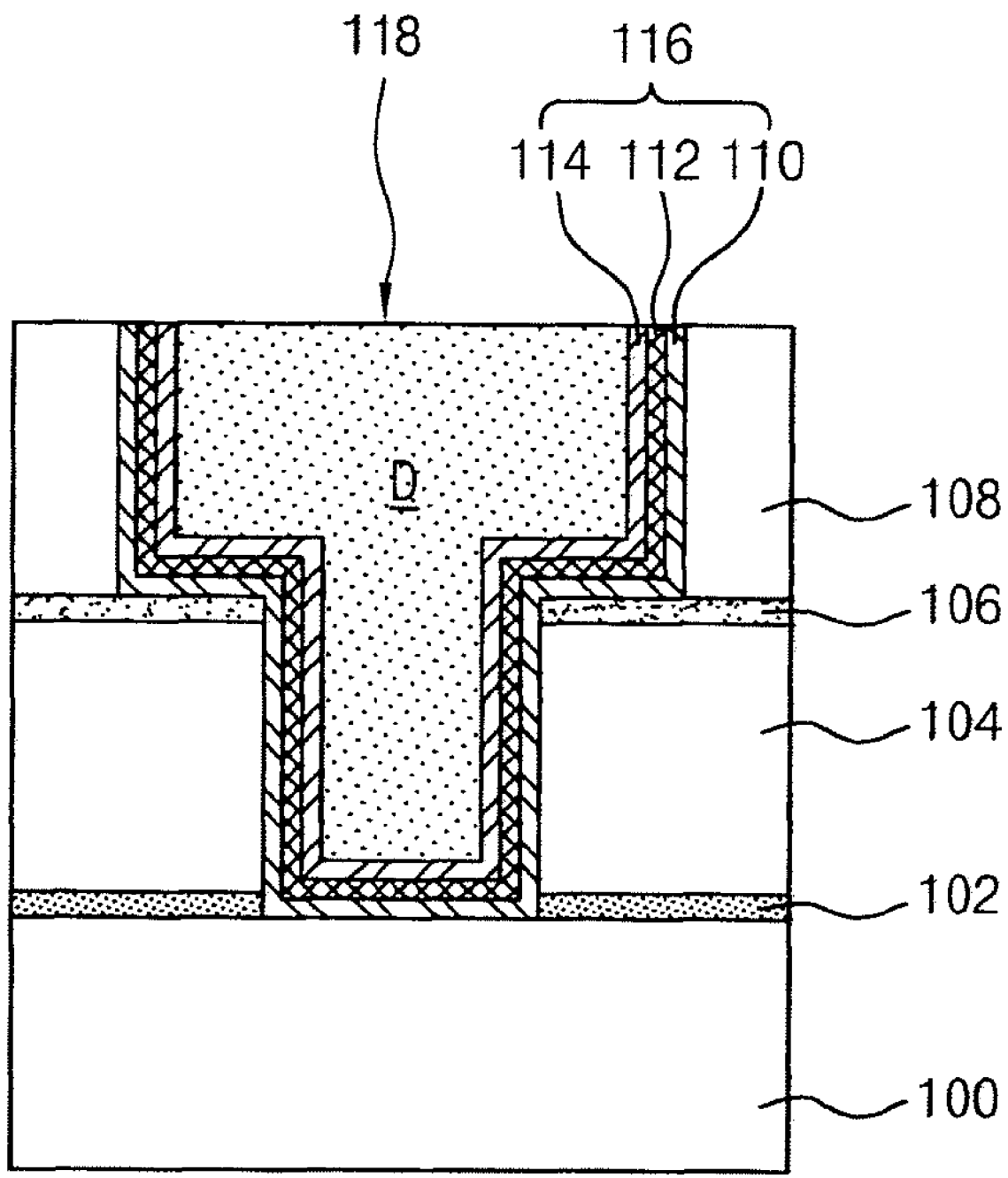
FIG. 1 is a cross-sectional view showing a metal line of a semiconductor device in accordance with an embodiment of the present invention.

FIG. 1 is a cross-sectional view showing a metal line of a semiconductor device in accordance with an embodiment of the present invention.

Referring to FIG. 1, first and second insulation layers 104 and 108 are formed on a semiconductor substrate 100 having a predetermined understructure (not shown) to define a metal line forming region D. The predetermined understructure is any one among a gate, a junction region or a lower metal line. A first etch stop layer 102 is formed between the semiconductor substrate 100 and the first insulation layer 104, and a second etch stop layer 106 is formed between the first insulation layer 104 and the second insulation layer 108. The metal line forming region D can be defined through a single damascene process or a dual damascene process to have a trench structure or a trench and via-hole structure which has a trench and at least one via-hole communicating with the trench.

A diffusion barrier 116 is formed on the surface of the metal line forming region D defined in the first and second insulation layers 104 and 108. The diffusion barrier 116 has a multi-layered structure of a V layer 110, a VN layer 112 and a VNO layer 114. The V layer 110 of the diffusion barrier 116 has a thickness in the range of 10~100 Å, and each of the VN layer 112 and the VNO layer 114 of the diffusion barrier 116 has a thickness in the range of 5~50 Å. The VN layer 112 preferably comprises a $V_xN_y$ layer ($0.8 \leq x \leq 0.95$, and $0.05 \leq y \leq 0.2$), and the VNO layer preferably comprises a $V_xN_yO_z$ layer ($0.7 \leq x \leq 0.94$, $0.05 \leq y \leq 0.2$, and $0.01 \leq z \leq 0.1$).

A metal line 118 is formed on the diffusion barrier 116 to fill the metal line forming region D defined in the first and second insulation layers 104 and 108. The metal line 118 comprises a copper layer.

According to the embodiment of the present invention, the diffusion barrier 116 having the multi-layered structure of the V layer 110, the VN layer 112 and the VNO layer 114 is formed between the copper layer and the first and second insulation layers 104 and 108. Therefore, in the present invention, it is possible to prevent a constituent of the copper layer from diffusing to the insulation layers 104 and 108. Accordingly, in the present invention, the characteristics of the diffusion barrier 116 can be improved even without increasing the thickness of the diffusion barrier 116 when compared to the conventional art. As a result, in the present invention, the characteristics and the reliability of a semiconductor device can be improved.

FIGS. 2A through 2G are cross-sectional views shown for illustrating the processes of a method for forming a metal line of a semiconductor device in accordance with another embodiment of the present invention.

Figure 2A:
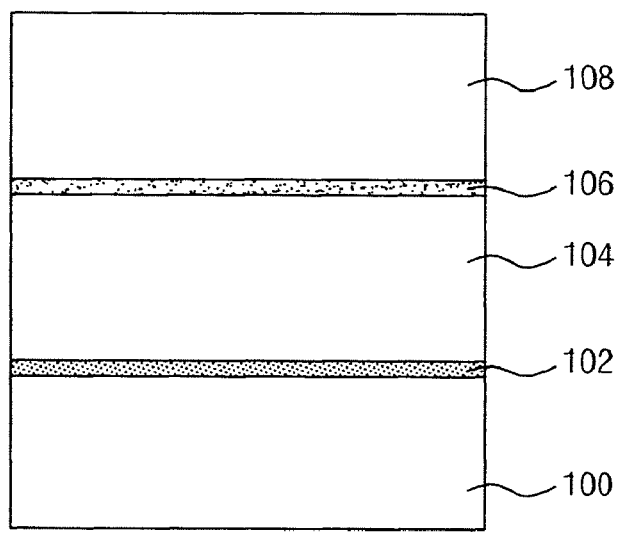
FIGS. 2A through 2G are cross-sectional views shown for illustrating the processes of a method for forming a metal line of a semiconductor device in accordance with another embodiment of the present invention.

Referring to FIG. 2A, first and second insulation layers 104 and 108 are sequentially formed on a semiconductor substrate 100 which is formed with a predetermined understructure (not shown). The first and second insulation layers 104 and 108 cover the understructure. Preferably, a first etch stop layer 102 and a second etch stop layer 106 are formed between the semiconductor substrate 100 and the first insulation layer 104 and between the first insulation layer 104 and the second insulation layer 108, respectively. The first and second etch stop layers 102 and 106 comprise, for example, SiN layers.

Figure 2B:
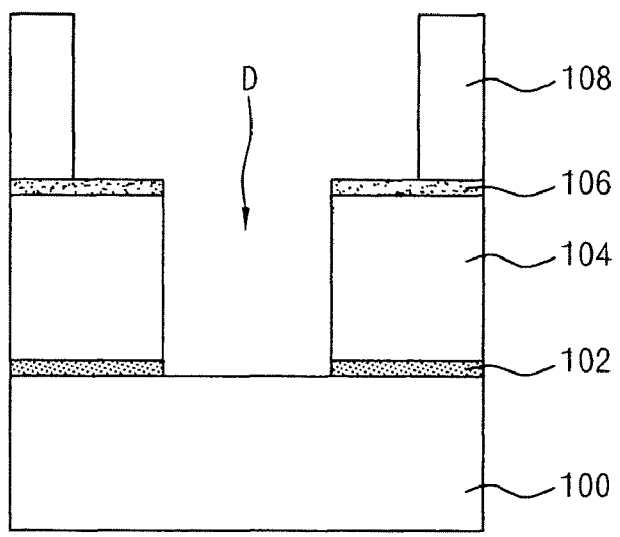

Referring to FIG. 2B, the second insulation layer 108, the second etch stop layer 106, the first insulation layer 104 and the first etch stop layer 102 are etched to define a metal line forming region D. The metal line forming region D can be defined through a single damascene process or a dual damascene process to have a trench structure or a trench and via-hole structure which has a trench and at least one via-hole communicating with the trench.

Figure 2C:
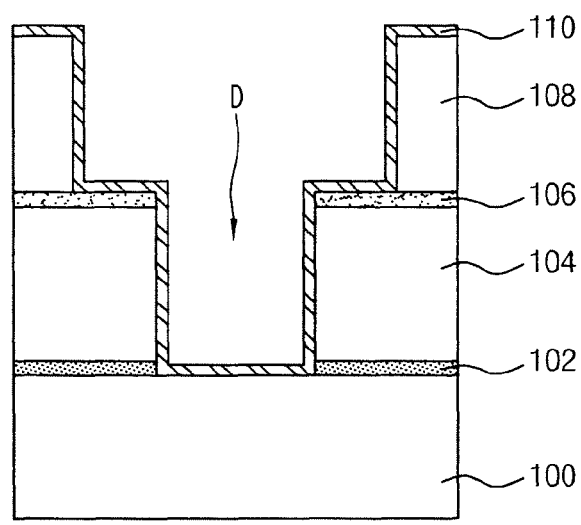

Referring to FIG. 2C, a V layer 110 is formed on the second insulation layer 108 and the surface of the metal line forming region D. The V layer 110 is formed to have a thickness in the range of 10~100 Å. The V layer 110 is formed through, for example, physical vapor deposition (PVD) or chemical vapor deposition (CVD). The CVD is conducted using $V(NMe_2)_4$ in the range of 10~100 sccm as source gas at a temperature in the range of 200~500° C. under pressure in the range f 0.1~10 Torr.

Figure 2D:
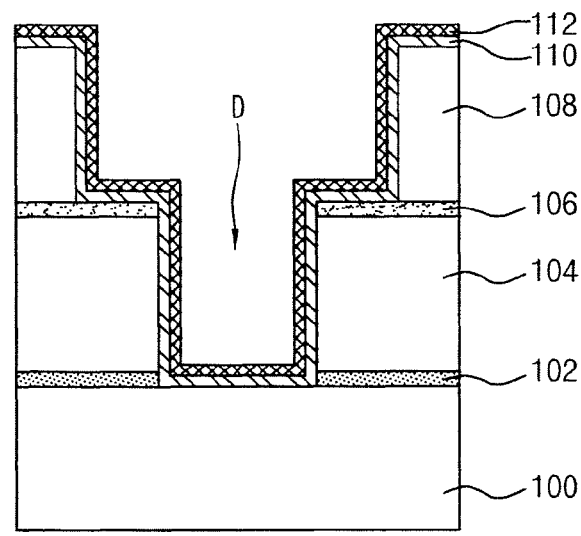

Referring to FIG. 2D, a VN layer 112, preferably, a $V_xN_y$ layer (0.8≦x≦0.95, and 0.05≦y≦0.2) is formed on the V layer 110. The VN layer 112 is formed through any one of PVD, CVD and atomic layer deposition (ALD) or by nitriding the surface of the V layer 110.

When using CVD to form the VN layer 112, the CVD is conducted using V(NMe$_2$)$_4$ and NH$_3$ each having an amount in the range of 10~100 sccm as source gas at a temperature in the range of 200~500° C. under pressure in the range of 0.1~10 Torr. When using ALD to form the VN layer 112, the ALD is conducted by alternately supplying V(NMe$_2$)$_4$ and NH$_3$ each having an amount in the range of 10~100 sccm as source gas at a temperature in the range of 200~500° C. under pressure in the range of 0.1~10 Torr.

The nitridation for forming the VN layer 112 is conducted by annealing the V layer 110 under a nitrogen atmosphere or plasma-processing the V layer 110, and through these processes, the VN layer 112 having a thickness in the range of 5~50 Å is formed on the V layer 110. The annealing is conducted using N$_2$ in the range of 10~1,000 sccm at a temperature in the range of 200~500° C., and the plasma processing is conducted using N$_2$ in the range of 10~500 sccm at a temperature in the range of 200~500° C. under pressure in the range of 1~10 Torr with RF (radio frequency) power in the range of 100~1,000 W.

Figure 2E:
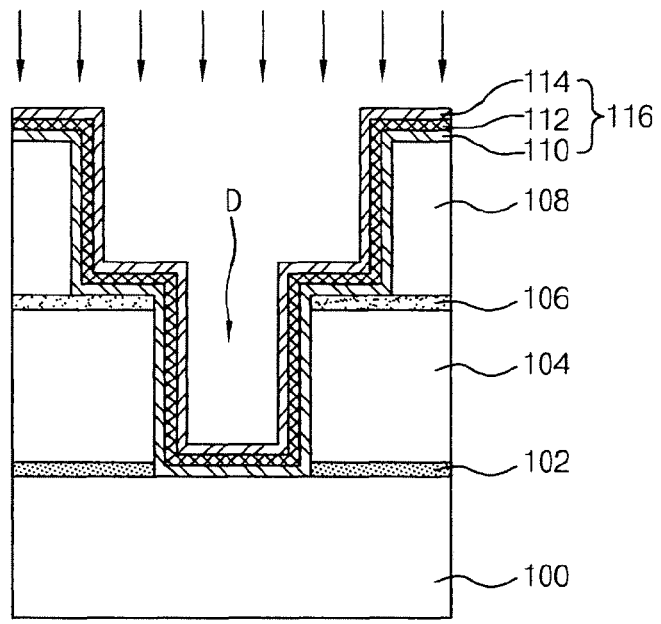

Referring to FIG. 2E, the surface of the VN layer 112 is oxidated to form a VNO layer 114, preferably, a $V_xN_yO_z$ layer (0.7≦x≦0.94, 0.05≦y≦0.2, and 0.01≦z≦0.1). The oxidation of the VN layer 112 is conducted by annealing the VN layer 112 under an oxygen atmosphere or plasma-processing the VN layer 112. Through this, the VNO layer 114 having a thickness in the range of 5~50 Å is formed on the surface of the VN layer 112. As a result, a diffusion barrier 116, which has a multi-layered structure of the V layer 110, the VN layer 112 and the VNO layer 114, is formed on the second insulation layer 108 and the surface of the metal line forming region D.

Figure 2F:
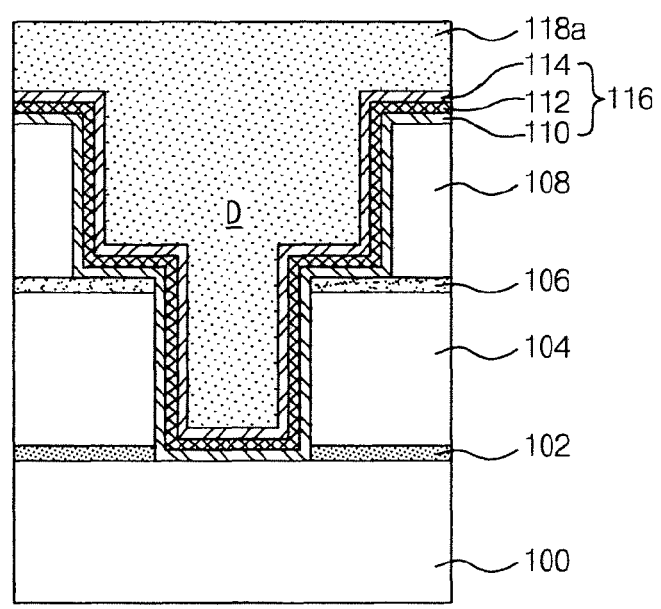

Referring to FIG. 2F, a metal layer 118a is formed on the diffusion barrier 116 to fill the metal line forming region D. The metal layer 118a comprises, preferably, a copper layer.

Figure 2G:
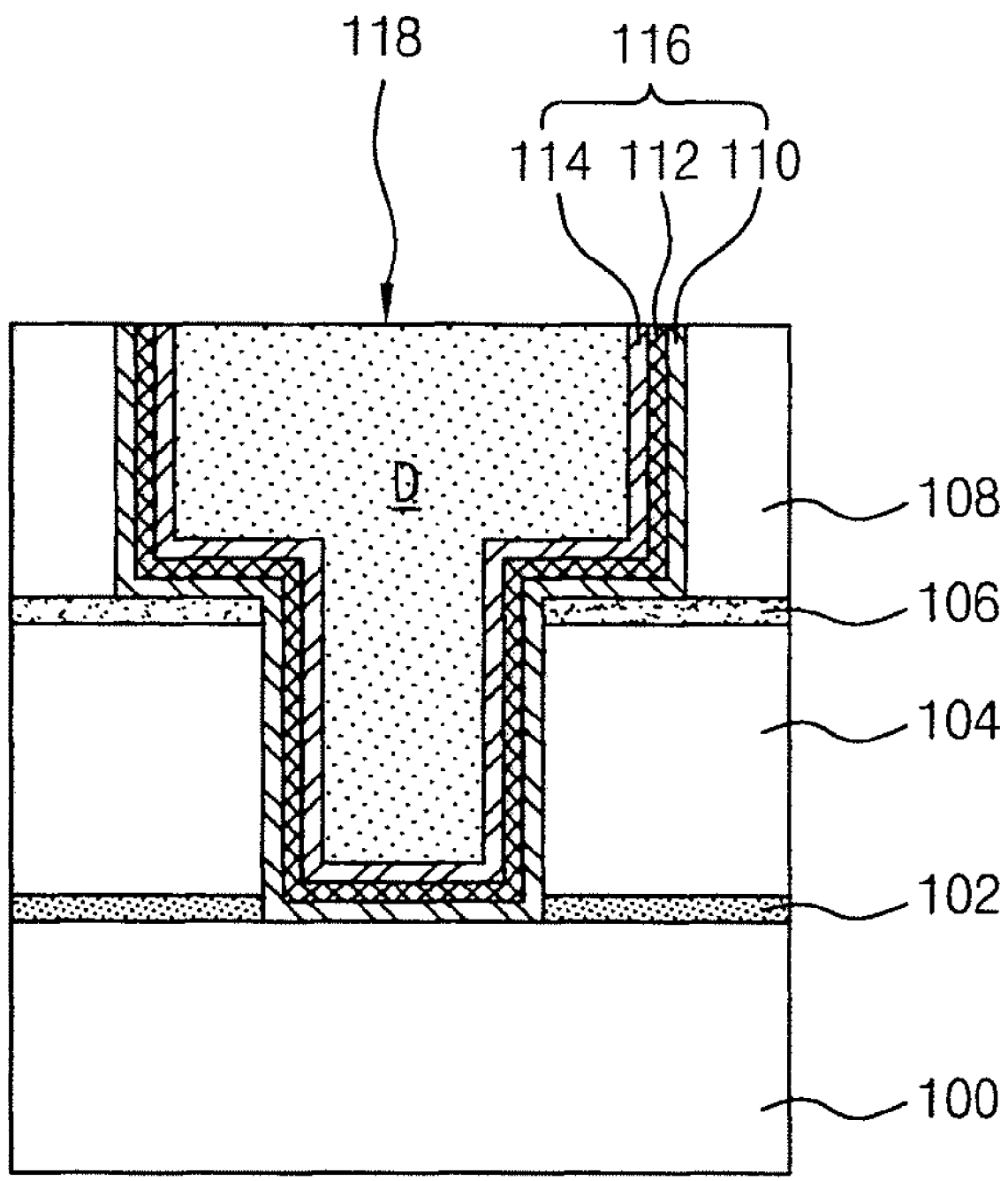

Referring to FIG. 2G, chemical mechanical polishing (CMPing) is performed on the metal layer 118a and the diffusion barrier 116 until the second insulation layer 108 is exposed, such that a metal line 118 is formed to fill the metal line forming region D.

Thereafter, while not shown in the drawings, by sequentially conducting a series of well-known subsequent processes, the formation of the metal line of a semiconductor device according to the embodiment of the present invention is completed.

As is apparent from the above description, in the present invention, a diffusion barrier including a V layer, a $V_xN_y$ layer and a $V_xN_yO_z$ layer is formed. Therefore, the characteristics of the diffusion barrier can be improved even without increasing the thickness of the diffusion barrier when compared to the conventional art. Through this, in the present invention, it is possible to prevent a constituent of a copper layer from diffusing to an insulation layer, and leakage current and contact resistance can be decreased. Accordingly, in the present invention, the characteristics and the reliability of a semiconductor device can be improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A metal line of a semiconductor device, comprising:
   an insulation layer formed on a semiconductor substrate and having a metal line forming region;
   a diffusion barrier formed on a surface of the metal line forming region of the insulation layer and having a multi-layered structure comprising a V layer, a $V_xN_y$ layer and a $V_xN_yO_z$ layer, wherein the V layer, the $V_xN_y$ layer and the $V_xN_yO_z$ layer are formed on a surface of the insulation layer in sequence; and
   a metal layer formed on the diffusion barrier in the metal line forming region of the insulation layer.

2. The metal line according to claim 1, wherein the V layer has a thickness in the range of 10~100 Å.

3. The metal line according to claim 1, wherein the $V_xN_y$ layer has a thickness in the range of 5~50 Å.

4. The metal line according to claim 1, wherein, in the $V_xN_y$ layer, x has a range of 0.8~0.95 and y has a range of 0.05~0.2.

5. The metal line according to claim 1, wherein the $V_xN_yO_z$ layer has a thickness in the range of 5~50 Å.

6. The metal line according to claim 1, wherein, in the $V_xN_yO_z$ layer, x has a range of 0.7~0.94 and y has a range of 0.05~0.2.

7. The metal line according to claim 1, wherein the metal layer comprises a copper layer, and the metal layer fills the metal line forming region.

8. A method for forming a metal line of a semiconductor device, comprising the steps of:
   forming an insulation layer having a metal line forming region on a semiconductor substrate;
   forming a V layer on the insulation layer and the surface of the metal line forming region;
   forming a $V_xN_y$ layer on the V layer;
   forming a $V_xN_yO_z$ layer by oxidating a surface of the $V_xN_y$ layer, so that a diffusion barrier having a multi-layered structure of the V layer, the $V_xN_y$ layer and the $V_xN_yO_z$ layer is formed on the insulation layer and a surface of the metal line forming region, wherein the V layer, the $V_xN_y$ layer and the $V_xN_yO_z$ are formed on a surface of the insulation layer in sequence; and
   forming a metal layer on the diffusion barrier in the metal line forming region.

9. The method according to claim 8, wherein the V layer is formed to have a thickness in the range of 10~100 Å.

10. The method according to claim 8, wherein the V layer is formed through PVD or CVD.

11. The method according to claim 8, wherein the V layer is formed through CVD, and the CVD is conducted using V(NMe$_2$)$_4$ in the range of 10~100 sccm as source gas.

12. The method according to claim 8, wherein the V layer is formed through CVD, and the CVD is conducted at a temperature in the range of 200~500° C. under pressure in the range of 0.1~10 Torr.

13. The method according to claim 8, wherein the $V_xN_y$ layer is formed as a layer in which x has a range of 0.8~0.95 and y has a range of 0.05~0.2.

14. The method according to claim 8, wherein the $V_xN_y$ layer is formed to have a thickness in the range of 5~50 Å.

15. The method according to claim 8, wherein the $V_xN_y$ layer is formed through any one of PVD, CVD and ALD.

16. The method according to claim 8, wherein the $V_xN_y$ layer is formed through CVD, and the CVD is conducted using V(NMe$_2$)$_4$ and NH$_3$ each having an amount in the range of 10~100 sccm as source gas.

17. The method according to claim 8 wherein the $V_xN_y$ layer is formed through CVD, and the CVD is conducted at a temperature in the range of 200~500° C. under pressure in the range of 0.1~10 Torr.

18. The method according to claim 8, wherein the $V_xN_y$ layer is formed through ALD, and the ALD is conducted by alternately supplying $V(NMe_2)_4$ and $NH_3$ each having an amount in the range of 10~100 sccm as source gas.

19. The method according to claim 8, wherein the $V_xN_y$ layer is formed through ALD, and the ALD is conducted at a temperature in the range of 200~500° C. under pressure in the range of 0.1~10 Torr.

20. The method according to claim 8, wherein the $V_xN_y$ layer is formed by nitriding a surface of the V layer.

21. The method according to claim 8, wherein the $V_xN_yO_z$ layer is formed as a layer in which x has a range of 0.7~0.94, y has a range of 0.05~0.2, and z has a range of 0.01~0.1.

22. The method according to claim 8, wherein the $V_xN_yO_z$ layer is formed to have a thickness in the range of 5~50 Å.

23. The method according to claim 8, wherein oxidation of the $V_xN_y$ layer is conducted by annealing the $V_xN_y$ layer under an oxygen atmosphere or plasma-processing the $V_xN_y$ layer.

24. The method according to claim 8, wherein the metal layer comprises a copper layer, and the metal layer is formed to fill the metal line forming region.

25. The method according to claim 20, wherein nitridation of the V layer is conducted by annealing the V layer under a nitrogen atmosphere or plasma-processing the V layer.

26. The method according to claim 20, wherein nitridation of the V layer is conducted by annealing the V layer, and the annealing is conducted using $N_2$ in the range of 10~1,000 sccm.

27. The method according to claim 20, wherein nitridation of the V layer is conducted by annealing the V layer, and the annealing is conducted at a temperature in the range of 200~500° C.

28. The method according to claim 20, wherein the nitridation of the V layer is conducted by plasma-processing the V-layer, and the plasma processing is conducted using $N_2$ in the range of 10~500 sccm.

29. The method according to claim 20, wherein the nitridation of the V layer is conducted by plasma-processing the V-layer, and the plasma processing is conducted at a temperature in the range of 200~500° C. under pressure in the range of 1~10 Torr.

30. The method according to claim 20, wherein the nitridation of the V layer is conducted by plasma-processing the V-layer, and the plasma processing is conducted with RF power in the range of 100~1,000W.

* * * * *